(12) United States Patent
Nishimura et al.

(10) Patent No.: US 7,893,597 B2
(45) Date of Patent: Feb. 22, 2011

(54) SURFACE ACOUSTIC WAVE ELEMENT AND SURFACE ACOUSTIC WAVE DEVICE

(75) Inventors: Yuriko Nishimura, Kyoto (JP); Shigehiko Nagamine, Shiga (JP); Kiyohiro Iioka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 775 days.

(21) Appl. No.: 11/577,867

(22) PCT Filed: Sep. 20, 2006

(86) PCT No.: PCT/JP2006/318632
§ 371 (c)(1),
(2), (4) Date: Apr. 24, 2007

(87) PCT Pub. No.: WO2006/034832
PCT Pub. Date: May 29, 2007

(65) Prior Publication Data
US 2009/0121584 A1    May 14, 2009

(30) Foreign Application Priority Data
Sep. 20, 2005  (JP)  ............... 2005-272451

(51) Int. Cl.
H03H 9/25 (2006.01)
H01L 41/047 (2006.01)
(52) U.S. Cl. .................. 310/313 B; 310/364
(58) Field of Classification Search ........... 310/313 A, 310/313 R, 364, 313 B; 333/150–153, 192–196
See application file for complete search history.

(56) References Cited

U.S. PATENT DOCUMENTS

| | | | |
|---|---|---|---|
| 6,218,763 B1 | 4/2001 | Fujimoto et al. | 310/313 R |
| 6,297,580 B1 | 10/2001 | Takayama et al. | |
| 6,538,359 B1 * | 3/2003 | Hiraku et al. | 310/313 R |
| 6,937,114 B2 | 8/2005 | Furukawa et al. | |
| 7,141,909 B2 | 11/2006 | Hada et al. | |
| 7,148,610 B2 | 12/2006 | Jacot et al. | |

(Continued)

FOREIGN PATENT DOCUMENTS

EP     0991186 A1     4/2000

(Continued)

OTHER PUBLICATIONS

Japanese language office action and its English translation for corresponding Japanese application No. 2007-507589 lists the references above.

(Continued)

Primary Examiner—Thomas M Dougherty
(74) Attorney, Agent, or Firm—DLA Piper LLP (US)

(57) ABSTRACT

A surface acoustic wave element 1 includes an IDT electrode 11 having an electrode finger 11a on a piezoelectric substrate 10. The electrode finger 11a is formed by laminating an intermediate layer 12 and an electrode layer 13 having a higher coefficient of thermal expansion than that of the intermediate layer 12. The electrode finger 11a has a cross section of a trapezoidal shape that widens nearer to the piezoelectric substrate 10. An angle $\alpha_1$ formed with a side surface of the intermediate layer 12 is formed larger than an angle $\beta_1$ formed with a side surface of the electrode layer 13.

19 Claims, 7 Drawing Sheets

U.S. PATENT DOCUMENTS

| | | | |
|---|---|---|---|
| 2004/0070313 A1 | 4/2004 | Furukawa et al. ....... | 310/313 R |
| 2004/0256950 A1 | 12/2004 | Hada et al. | |

FOREIGN PATENT DOCUMENTS

| | | |
|---|---|---|
| EP | 1460759 A1 | 9/2004 |
| JP | 01212909 A | 8/1989 |
| JP | 03-217109 | 9/1991 |
| JP | 2000-138551 | 5/2000 |
| JP | 2001-168671 | 6/2001 |
| JP | 2001-217672 | 8/2001 |
| JP | 2002080980 A | 3/2002 |
| JP | 2005516517 A | 6/2005 |
| WO | WO 03/058813 A1 | 7/2002 |
| WO | 03065577 A1 | 8/2003 |

OTHER PUBLICATIONS

European search report for European application 06810328.2 lists the references above.

European search report for European application 068110328.2 lists the references above.

\* cited by examiner

SURFACE ACOUSTIC WAVE ELEMENT AND SURFACE ACOUSTIC WAVE DEVICE

CROSS-REFERENCE TO THE RELATED APPLICATIONS

This application is a national phase of the international application No. PCT/JP2006/318632 filed Sep. 20, 2006, the entire contents of which are incorporated by reference. This application also claims benefit of priority under 35 U.S.C. §119 to Japanese Patent Application No. 2005-272451 filed Sep. 20, 2005, the entire contents of which are incorporated by reference.

TECHNICAL FIELD

The present invention relates to a surface acoustic wave element having an IDT electrode formed on a piezoelectric substrate, and a surface acoustic wave device carrying the same.

BACKGROUND ART

Surface acoustic wave elements in which inter digital transducer (hereinafter merely referred to as IDT) electrodes are formed on piezoelectric substrates have been conventionally known. The IDT electrode can mutually convert an electrical signal and a surface acoustic wave. In addition to the IDT electrode, the surface acoustic wave element can confine energy by arranging reflector electrodes at positions between which the IDT electrode is sandwiched and multiple-reflecting the surface acoustic wave excited by the IDT electrode using the reflector electrodes on both sides thereof.

In a duplexer used for a mobile terminal device such as a portable telephone, a surface acoustic wave device carrying a surface acoustic wave element having a high performance and capable of reducing size and weight has been used in recent years although a dielectric filter was conventionally used in principle. The input power level of the surface acoustic wave device has widened from a 10 mW level for an inter-stage filter in the mobile terminal device to 1 to 3 W levels required for the duplexer in the mobile terminal device with the spread of an application range of the surface acoustic wave device. In the surface acoustic wave device used in the duplexer for the mobile terminal device, therefore, the requirement of the input power level has increased.

On the other hand, in recent years, the operating frequency of the surface acoustic wave element has increased from several hundred megahertz to several gigahertzes. The line width of the IDT electrode included in the surface acoustic wave element has decreased with the increase in the operating frequency in inverse proportion to the frequency. Specifically, the line width of the IDT electrode is approximately 1 μm in an 800 MHz band, while being approximately 0.5 μm in a 1.9 GHz band. Therefore, an electrode finger formed in a comb shape in the IDT electrode requires fine processing with the increase in a frequency band.

The line width of the IDT electrode reduces, and the input power level of the surface acoustic wave element included in the duplexer increases, as described above, so that the power-resistant life of the surface acoustic wave element in the GHz band decreases by two or more figures than the surface acoustic wave device in the 800 MHz band.

In a case where the surface acoustic wave is excited and received using the fine electrode finger in the IDT electrode corresponding to the high frequency, when signal power applied to the surface acoustic wave device increases, a main surface of a piezoelectric substrate is distorted by the surface acoustic wave at the time of driving the surface acoustic wave device, so that an internal stress is created in the electrode finger in the IDT electrode. This internal stress causes a stress migration phenomenon to appear in the electrode finger. Therefore, the electrode finger is destroyed, and the IDT electrode is degraded.

As a result of stress migration, holes are accumulated in an Al grain boundary, so that a void and a hillock are produced. In the surface acoustic wave device, therefore, there arises characteristic degradation of performance such as propagation or resonance of the surface acoustic wave and destruction of the electrode finger.

Consequently, the surface acoustic wave element including the IDT electrode further requires durability against application of high power as applications are diversified. Therefore, an IDT electrode having an electrode finger whose durability is increased by laminating different materials has been developed in place of a conventional IDT electrode having an electrode finger formed of a single layer of a metal material such as Al or an Al alloy.

Figure 13:
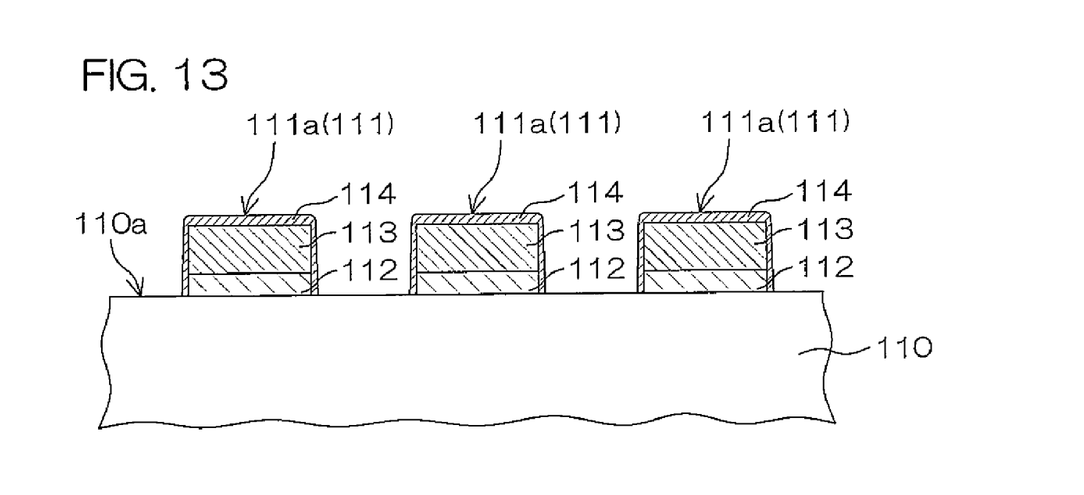
FIG. 13 is an enlarged sectional view of an electrode finger in a conventional IDT electrode.

For example, in Japanese Unexamined Patent Publication No. 2001-217672, a configuration has been proposed in which an intermediate layer 112 formed of a material such as Ti (titanium) is arranged between an Al electrode layer 113 and a piezoelectric substrate 110, and is covered with a protective film (metal film) 114 for the purpose of restraining the occurrence of stress migrations in the IDT electrode 111, as shown in FIG. 13 in the present application.

Japanese Unexamined Patent Publication No. 2001-168671 discloses a structure of an IDT electrode formed by laminating a first metal layer and a second metal layer. A cross section of the IDT electrode is in such a trapezoidal shape that its lower surface closer to a piezoelectric substrate is wider than its upper surface.

Japanese Unexamined Patent Publication No. 3-217109 discloses a structure of a reflector electrode formed of a single metal layer and having a trapezoidal cross section.

International Publication No. WO2003/058813A1 discloses a structure of an IDT electrode formed by laminating a first metal layer having a trapezoidal cross section and a second metal layer having a rectangular cross section.

In the structure of the IDT electrode 111 in Japanese Unexamined Patent Publication No. 2001-217672, respective side surfaces of the intermediate layer 12 and the electrode layer 113 are formed almost perpendicular to the main surface 110a of the piezoelectric substrate 110. In this case, when the protective film 114 is formed by a film deposition method by which few evaporated species enter a masked area, such as an evaporation method, a material forming the protective film 114 is incident from a direction substantially perpendicular to the main surface 110a of the piezoelectric substrate 110, so that the protective film 114 is formed thin on a side surface of the electrode finger 111a. Therefore, generating of stress migrations cannot be controlled and as a result, fracture and stripping of the electrode may occur.

Although Japanese Unexamined Patent Publication No. 2001-168671 discloses the IDT electrode composed of two types of electrode layers formed of different materials and having a trapezoidal cross section, a shear stress is likely to arise on a boundary surface between the two types of electrode layers because the electrode layers differ in coefficients of thermal expansion.

Japanese Unexamined Patent Publication No. 3-217109 discloses only the structure of the reflector electrode having a trapezoidal cross section.

In International Publication No. WO2003/058813A1, when a shear stress arises on a boundary surface between two types of electrode layers because the electrode layers differ in coefficients of thermal expansion, each of the electrode layers cannot be prevented from being fractured and stripped, as in Japanese Unexamined Patent Publication No. 2001-168671.

DISCLOSURE OF INVENTION

An object of the present invention is to provide a surface acoustic wave element whose durability can be enhanced by comprising an IDT electrode serving as an electrode finger having a plurality of conductor layers laminated therein while being capable of restraining the fracture and the stripping, for example, of the conductor layers and a surface acoustic wave device carrying the same.

According to a surface acoustic wave element in the present invention, an electrode finger is formed by laminating a plurality of conductor layers including a first conductor layer and a second conductor layer formed of a material different from a material forming the first conductor layer. The first conductor layer has a trapezoidal shape that widens nearer to a piezoelectric substrate in cross section through a plane perpendicular to the longitudinal direction of the electrode finger, and the second conductor layer has a trapezoidal shape that widens nearer to the piezoelectric substrate in a cross section through a plane perpendicular to the longitudinal direction of the electrode finger. An angle formed between a side surface of the first conductor layer and a main surface of the piezoelectric substrate differs from an angle formed between a side surface of the second conductor layer and the main surface of the piezoelectric substrate.

According to this configuration, the electrode finger has the two conductor layers laminated therein and is formed by the first conductor layer (intermediate layer) formed on the main surface of the piezoelectric substrate and the second conductor layer (electrode layer) formed on the first conductor layer. Each of the fist conductor layer and the second conductor layer included in the electrode finger is so formed that the cross section through the plane perpendicular to the longitudinal direction of the electrode finger widens nearer to the main surface of the piezoelectric substrate. That is, each of the first conductor layer and the second conductor layer has a trapezoidal shape.

Since each of the conductor layers can have trapezoidal shapes having different angles of inclination, the fracture and the stripping, for example, of the protective film can be further restrained even if the materials forming the conductor layers differ in properties (e.g., coefficients of thermal expansion). This allows to restrain the fracture and the stripping of the protective film satisfactorily while forming the electrode finger by the plurality of conductor layers, thereby allowing to enhance the durability of the surface acoustic wave element.

Although description is made using the example of the electrode finger having the two conductor layers laminated therein, the present invention is also satisfactorily applicable to an electrode finger having three or more conductor layers laminated therein.

When the second conductor layer is formed of a material having a higher coefficient of thermal expansion than the material forming the first conductor layer, it is preferable that the angle formed between the side surface of the first conductor layer and the main surface of the piezoelectric substrate is formed larger than the angle formed between the side surface of the second conductor layer and the main surface of the piezoelectric substrate.

According to this configuration, the coefficient of thermal expansion of the first conductor layer is lower than the coefficient of thermal expansion of the second conductor layer, so that a width of thermal expansion occurring in the first conductor layer is smaller than the width of thermal expansion occurring in the second conductor layer. The "width of thermal expansion" herein represents a width of extension in a direction substantially perpendicular to the side surface of each of the conductor layers. In addition thereto, the angle with the side surface of the first conductor layer is formed larger than the angle with the side surface of the second conductor layer, so that a shear stress due to a difference in the width of thermal expansion between the conductor layers forming the electrode finger can be relaxed. Accordingly, a difference between the extensions in a direction along the main surface of the piezoelectric substrate by the widths of thermal expansion in the conductor layers can be reduced, as compared with that in a case where the respective angles with the side surfaces of the conductor layers are the same.

When the second conductor layer is formed of a material having a lower coefficient of thermal expansion than the material forming the first conductor layer, the angle formed between the side surface of the first conductor layer and the main surface of the piezoelectric substrate can be formed smaller than the angle formed between the side surface of the second conductor layer and the main surface of the piezoelectric substrate. This allows to restrain the fracture and the stripping, for example, of the protective film covering the surface of the electrode finger satisfactorily while forming the electrode finger by the plurality of conductor layers, thereby allowing to enhance the durability of the surface acoustic wave element.

It is preferable that the first conductor layer is formed in contact with the main surface of the piezoelectric substrate, the second conductor layer is formed on the first conductor layer, and the width of the cross section opposed to the second conductor layer of the first conductor layer is formed larger than the width of the cross section opposed to the first conductor layer of the second conductor layer. According to this configuration, a joint surface of the second conductor layer is formed smaller than a joint surface of the first conductor layer, so that the protective film can be laminated in an area (a step) from the side surface of the first conductor layer to the side surface of the second conductor layer on the first conductor layer. Accordingly, the extension due to the thermal expansion in the second conductor layer is restrained by the protective film on the first conductor layer. Therefore, a shear stress created in the boundary between the first conductor layer and the second conductor layer can be further restrained.

The electrode finger in the IDT electrode may be covered with a protective film. This can prevent each of the conductor layers forming the electrode finger from being stripped.

It is preferable that the protective film is formed of a material having a lower coefficient of thermal expansion than one having the largest coefficient of thermal expansion among the conductor layers forming the electrode finger. Accordingly, the protective film can restrain the extensions due to the thermal expansion in the first conductor layer and the second conductor layer.

The protective film may be formed only on the IDT electrode, and may contain at least one of Ti, Cr, Nb, Pd, Cu, and Ni as a material.

A surface acoustic wave device according to the present invention is so adapted that the above-mentioned surface acoustic wave element is mounted on a mounting substrate, and has an IDT electrode having high reliability, as described above. Thus, a longer life can be expected for the surface acoustic wave device.

As described in the foregoing, according to the present invention, the shear stress created in the electrode finger in the IDT electrode can be relaxed. This allows to improve the temperature characteristics of the surface acoustic wave element. Further, the production of a hillock and a void due to stress migrations can be restrained. Therefore, it is less likely to destroy the IDT electrode against high input power, thereby allowing to improve the durability of the surface acoustic wave element.

The foregoing and other objects, features, aspects and advantages of the present invention will become more apparent from the following detailed description of the present invention when taken in conjunction with the accompanying drawings.

BEST MODE FOR CARRYING OUT THE INVENTION

Figure 1:
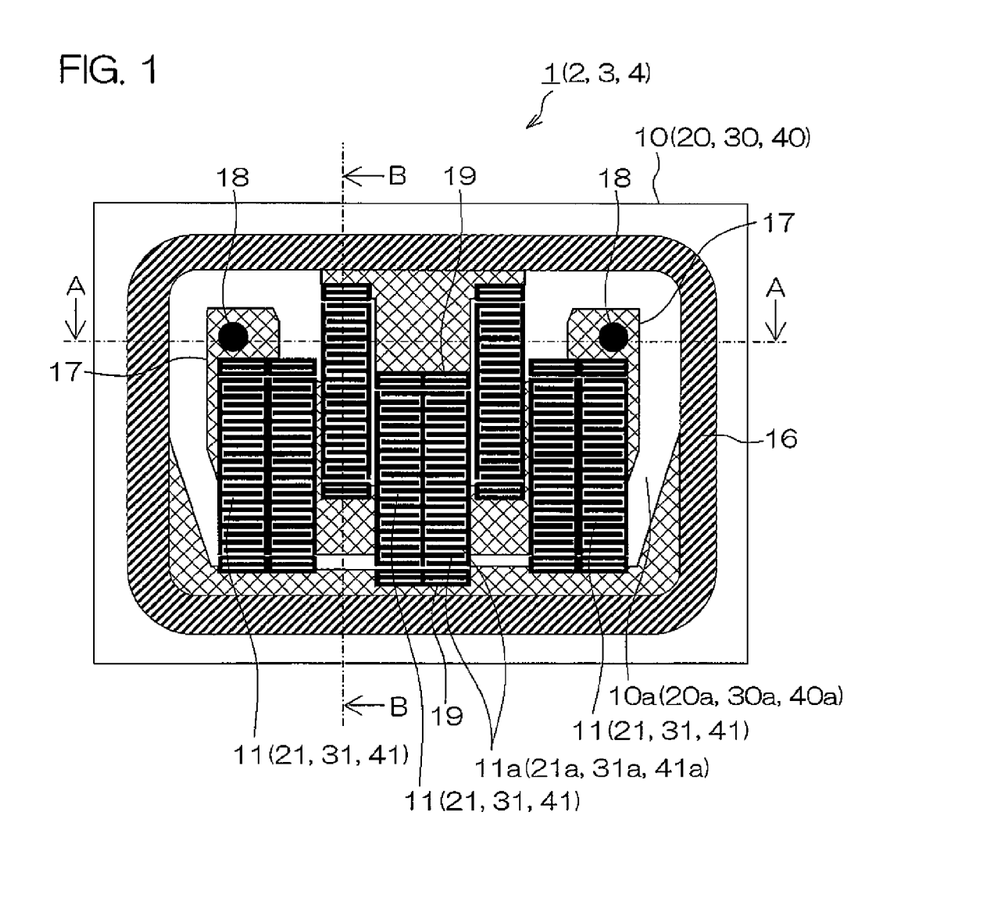
FIG. 1 is a plan view of a surface acoustic wave element according to an embodiment of the present invention.
Figure 2:
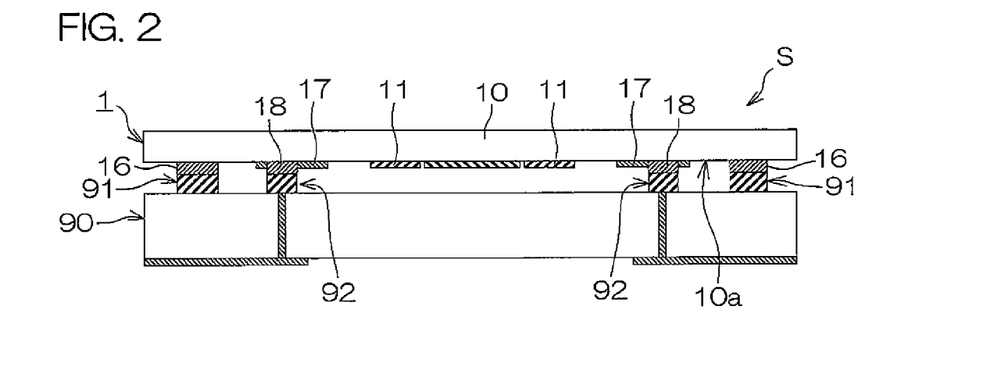
FIG. 2 is a cross-sectional view taken along a line A-A showing a state where a surface acoustic wave element is mounted on a mounting substrate.

FIG. 1 is a plan view of a ladder-type surface acoustic wave element according to an embodiment of the present invention. FIG. 2 is a cross-sectional view taken along a line A-A in a case where the surface acoustic wave element is mounted on a mounting substrate.

A surface acoustic wave element 1 has a piezoelectric substrate 10, and an IDT electrode 11 formed on a main surface 10a of the piezoelectric substrate 10. Here, "the main surface 10a of the piezoelectric substrate 10" refers to a surface on which the IDT electrode 11 is formed in the plate-shaped piezoelectric substrate 10.

The surface acoustic wave element 1 comprises reflector electrodes (hereinafter also referred to as reflectors) 19 having a slit shape at positions between which the IDT electrode 11 is sandwiched in the direction of signal propagation of the IDT electrode 11 (in a top-and-bottom direction on a paper surface). The reflector 19 can multi-reflect a surface acoustic wave excited in the IDT electrode 11 and can configure energy of the generated surface acoustic wave.

In the surface acoustic wave element 1, an annular electrode 16 is formed at a position enclosing the IDT electrode 11 and the reflector 19 on the main surface 10a of the piezoelectric substrate 10. In addition thereto, a wiring electrode pad 18 connected to the IDT electrode 11 through a pull-out electrode 17 is formed on the surface acoustic wave element 1.

The surface acoustic wave element 1 is placed and fixed on the mounting substrate 90 made of resin using a so-called face-down system with the main surface 10a having the IDT electrode 11 formed thereon opposed to an upper surface of the mounting substrate 90. The annular electrode 16 is joined to an annular conductor opposed thereto on the mounting substrate 90 through a jointing material such as solder to join the wiring electrode pad 18 to a wiring conductor opposed thereto on the mounting substrate 90 as shown in FIG. 2 that is a cross-sectional view. The joint surfaces are joined to each other by subjecting the jointing material to reflow melting. The reflow melting forms an annular electrode portion 91 having the annular electrode 16 and the annular conductor jointed to each other, and a wiring electrode portion 92 having the wiring electrode pad 18 and the wiring conductor joined to each other.

In such a way, the surface acoustic wave element 1 is placed and fixed on the mounting substrate 90 and is flip-chip mounted thereon, thereby manufacturing a surface acoustic wave device S configured by electrically and mechanically connecting the surface acoustic wave element 1 to the mounting substrate 90.

The piezoelectric substrate 10 is formed of a material having piezoelectric properties such as a 38.7° Y-cut X-propagation $LiTaO_3$ single crystal, a 64° Y-cut X-propagation $LiNbO_3$ single crystal, a 45° X-cut Z-propagation $LiB_4O_7$ single crystal, or the like. This allows to increase the electromechanical coupling coefficient and to decrease the group delay time temperature coefficient of the piezoelectric substrate 10, respectively.

The thickness of the piezoelectric substrate 10 is preferably 0.15 to 0.5 mm. In a case where the thickness is less than 0.15 mm, the piezoelectric substrate 10 is brittle and is damaged easily. In contrast, in a case where the thickness is 0.5 mm, the material cost is increased.

The IDT electrode 11 formed on the main surface 10a of the piezoelectric substrate 10 has a pair of electrode fingers 11a formed in such a comb shape that they are interdigitated with each other, as shown in FIG. 1.

The number of electrode fingers 11a on each side is preferably 50 to 200. The width of each of the electrode fingers 11a is 0.1 to 10 μm. A clearance (pitch) between the adjacent electrode fingers 11a is 0.1 to 10 μm. A length (cross width) in which the opposed electrode fingers 11a are interdigitated with each other is 10 to 300 μm. The IDT electrode 11 has a height (thickness) of 0.1 to 0.6 μm in order to satisfactorily obtain prescribed characteristics as a surface acoustic wave resonator and a surface acoustic wave filter.

The IDT electrode 11 is formed by an electrode layer composed of an Al alloy like Al—Cu or the like and a Ti intermediate layer, as described later, using a thin film deposition method such as a sputtering method, evaporation method, or a CVD (Chemical Vapor Deposition)

A metal added to Al as the above-mentioned Al alloy is Cu. In some cases, metals such as Ti, Ta, W, Mo, and Mg may be used together with or in place of Cu. The IDT electrode 11 has a predetermined shape by patterning using a photolithographic method and etching.

The above-mentioned materials forming the IDT electrode 11 are also applicable to the reflector 19 having such a slit shape that a plurality of electrode fingers are arranged parallel to one another.

Figure 12:
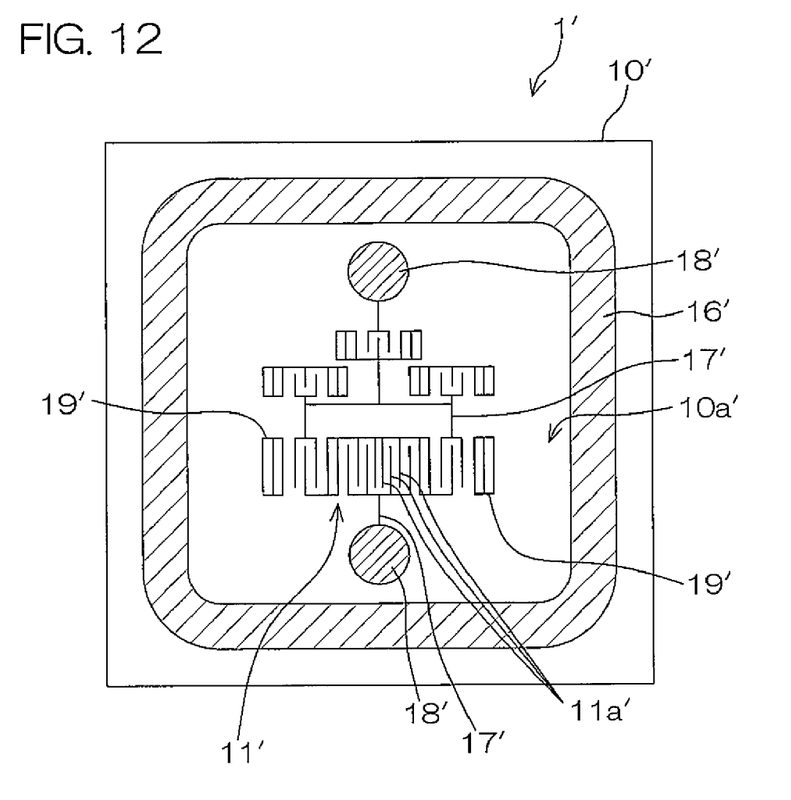
FIG. 12 is a plan view of a surface acoustic wave element according to a still further embodiment of the present invention.

Although the ladder-type surface acoustic wave filter is illustrated as the surface acoustic wave element 1 in FIG. 1, the surface acoustic wave element 1 may be composed of a DMS-type surface acoustic wave resonator filter shown in FIG. 12.

The DMS-type surface acoustic wave resonator filter shown in FIG. 12 has a piezoelectric substrate 10' and IDT electrodes 11' formed on a main surface 10a' of the piezoelectric substrate 10', similarly to the ladder-type surface acoustic wave element 1 shown in FIG. 1. The IDT electrodes 11' are coupled to each other through a pull-out wire 17'. The surface acoustic wave element 1' comprises reflectors 19' at positions between which the IDT electrodes 11' are sandwiched in the direction of signal propagation in the IDT electrodes 11' (in a left-and-right direction on a paper surface). In the surface acoustic wave element 1', an annular electrode 16' is formed at a position enclosing the IDT electrodes 11' and the reflectors 19' of the main surface 10a' of the piezoelectric substrate 10'. In addition thereto, wiring electrode pads 18' each connected to the IDT electrodes 11' through the pull-out wires 17' are formed in the surface acoustic wave element 1'.

Although description is now made to the structure of the IDT electrode on the basis of the ladder-type surface acoustic wave element 1 shown in FIG. 1, it should be noted that the structure of the IDT electrode 11' in the DMS-type surface acoustic wave resonator filter shown in FIG. 12 is the same.

Figure 3:
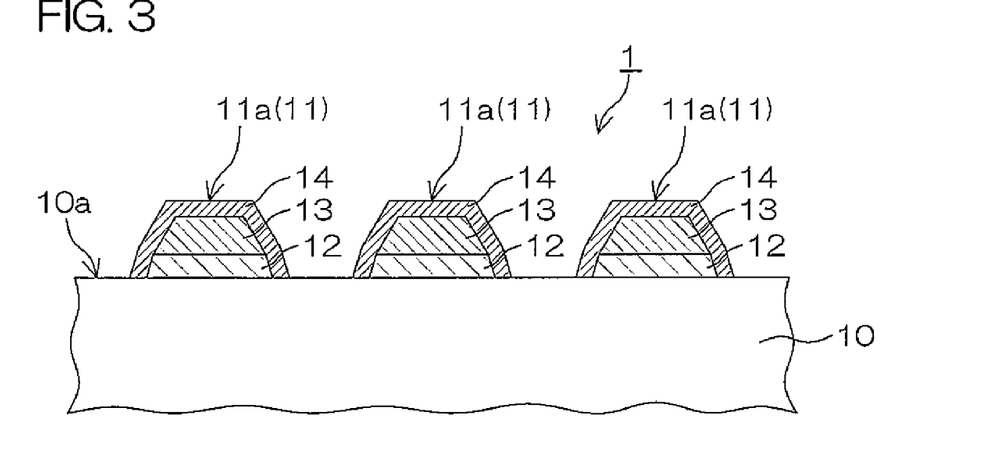
FIG. 3 is a cross-sectional view of a principal part taken along a line B-B shown in FIG. 1 of an IDT electrode included in a surface acoustic-wave element 1.
Figure 4:
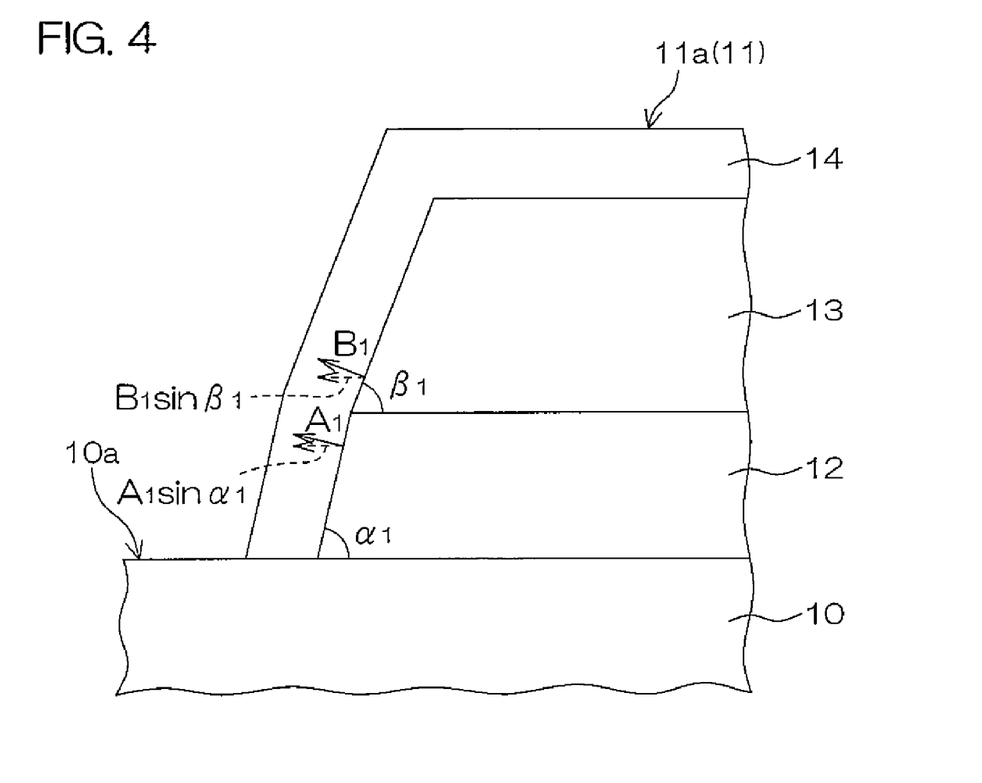
FIG. 4 is an enlarged sectional view of one electrode finger in the IDT electrode.

FIG. 3 is a cross-sectional view of a principal part taken along a line B-B shown in FIG. 1 of the IDT electrode 11 included in the surface acoustic wave element 1. FIG. 4 is an enlarged sectional view of one electrode finger 11a in the IDT electrode 11.

The surface acoustic wave element 1 has an electrode finger 11a having a plurality of conductor layers laminated therein provided on the main surface 10a of the piezoelectric substrate 10 as the IDT electrode 11. The electrode finger 11a is covered with a protective film 14.

The electrode finger 11a has two conductor layers, i.e., a first conductor layer (hereinafter also referred to as an intermediate layer) 12 formed on the main surface 10a of the piezoelectric substrate 10 and a second conductor layer (hereinafter referred to as an electrode layer) 13 formed on the intermediate layer 12 laminated therein, as shown in FIG. 3.

Each of the intermediate layer 12 and the electrode layer 13 is so formed that its cross section through a plane perpendicular to the longitudinal direction of the electrode finger 11a widens nearer to the main surface 10a of the piezoelectric substrate 10, as shown in FIG. 3. That is, each of the intermediate layer 12 and the electrode layer 13 has a trapezoidal shape in the cross section.

Even if a material forming the protective film 14 is incident from a direction substantially perpendicular to the main surface 10a of the piezoelectric substrate 10 using a film deposition method by which few evaporated species enter a masked area, the protective film 14 can be formed in a sufficient thickness on a side surface of the electrode finger 11a, so that the fracture and the stripping of the protective film 14 can be restrained.

The intermediate layer 12 is formed of a metal material such as Ti (let $\rho_{12}$ be its coefficient of thermal expansion, $\rho_{12}=8/9\times10^{-6}/K$).

The electrode layer 13 is formed of a metal material such as an Al alloy having a higher coefficient of thermal expansion than that of the material forming the intermediate layer 12, e.g., an Al—Cu (Cu: 1% by weight) alloy (let $\rho_{13}$ be its coefficient of thermal expansion, $\rho_{13}=23.5\times10^{-6}/K$).

Furthermore, the electrode layer 13 can be formed of a metal material having a metal such as Ti, Ta, W, Mo, or Mg, described above, added thereto together with or in place of Cu as a material to be contained in Al serving as a main component.

The electrode layer 13 and the intermediate layer 12 serving as two conductor layers included in the electrode finger 11a are formed such that an angle $\alpha_1$ (e.g., 65°) formed between a side surface of the intermediate layer 12 and the main surface 10a of the piezoelectric substrate 10 is larger than an angle $\beta_1$ (e.g., 58°) formed between a side surface of the electrode layer 13 and the main surface 10a of the piezoelectric substrate 10 ($\alpha_1 > \beta_1$), as shown in FIG. 4. This allows to disperse a stress created in each of the conductor layers in the electrode finger 11a (the details will be described later).

The angle with the side surface of each of the conductor layers in the electrode finger 11a can be adjusted by etching, as described below. That is, the conductor layers in the electrode finger 11a are laminated, and the shape of each conductor layer is patterned using a photolithographic technique, and a dry etching method thereafter. In the dry etching method, $Cl_2$, $BCl_3$ and $N_2$ are used as reaction gas, and etching conditions such as gas flow rate, pressure, applied power, and time are adjusted to control a side etching amount (an etching amount on the side surface of each of the conductor layers) utilizing a difference in etching rates between Ti and an Al alloy. This allows to adjust the respective angles $\alpha_1$ and $\beta_1$ with the side surfaces of the conductor layers (the intermediate layer 12 and the electrode layer 13) in the electrode finger 11a. Specifically, it is effective to increase the gas concentration of $BCl_3$ and increase power to apply in order to increase the side etching amount, i.e., reduce the angle formed between the side surface of the conductor layer and the main surface of the piezoelectric substrate.

The protective film 14 is provided so as to protect the electrode finger 11a. After the IDT electrode 11 is formed, the protective film 14 is formed by forming a predetermined material on the IDT electrode 11 using a CVD method. The protective film 14 can be also formed using a method such as a sputtering method or an evaporation method in addition to the CVD method.

The protective film 14 can use a conductor protective film formed of a material having conductive properties, a semiconductor film formed of a material having semiconductor properties, or an insulation protective film formed of a material having insulation properties.

Although description is herein made to a case where the conductor protective film is formed of Ti, it can be mainly composed of any of metal materials such as Cr, Nb, Pd, Cu, and Ni other than Ti. The conductor protective film 14 is formed only on the electrode finger 11a in the IDT electrode 11.

The insulation protective film is formed of a material having insulation properties such as silicon dioxide or silicon nitride. The semiconductor film is formed of a material having semiconductor properties such as polycrystalline silicon. At this time, the insulation protective film and the semiconductor film may be formed only on the electrode finger 11a. Alternatively, they can be also formed on the main surface 10a of the piezoelectric substrate 10 in addition to the electrode finger 11a.

Description is now made to a mechanism for relaxing a shear stress created in each of the conductor layers based on the setting of the angles $\alpha_1$ and $\beta_1$ in the surface acoustic wave element 1.

In the vicinity of the side surface of each of the conductor layers (the intermediate layer 12 and the electrode layer 13), a stress due to thermal expansion of the conductor layer is created outward in a direction substantially perpendicular to the side surface of the conductor layer. As shown in FIG. 4, an extension occurs by a width $A_1$ of thermal expansion in the vicinity of the side surface of the intermediate layer 12, and an extension occurs by a width $B_1$ of thermal expansion in the vicinity of the side surface of the electrode layer 13. Here, "the width of thermal expansion" represents a width of extension in the direction substantially perpendicular to the side surface of each of the conductor layers, and is defined by the volume of the conductor layer, the width thereof in a plane direction, the coefficient of thermal expansion p thereof, and so on.

In this example, the coefficient of thermal expansion $\rho_{12}$ of the intermediate layer 12 is lower than the coefficient of thermal expansion $\rho_{13}$ of the electrode layer 13, so that the width $A_1$ of thermal expansion is smaller than the width $B_1$ of thermal expansion ($A_1 < B_1$).

Accordingly, the extension occurring in the direction along the main surface 10a of the piezoelectric substrate 10 by the width $A_1$ of thermal expansion is $A_1 \sin \alpha_1$ in the intermediate layer 12, and the extension occurring in the direction along the main surface 10a of the piezoelectric substrate 10 by the width $B_1$ of thermal expansion is $B_1 \sin \beta_1$ in the electrode layer 13.

Here, the angle $\alpha_1$ with the side surface of the intermediate layer 12 is formed larger than the angle $\beta_1$ with the side surface of the electrode layer 13 ($\sin \alpha_1 > \sin \beta_1$), so that a difference between the respective extensions ($A_1 \sin \alpha_1$ and $B_1 \sin \beta_1$) occurring in the direction along the main surface 10a of the piezoelectric substrate 10 in the conductor layers can be reduced, as compared with that in a case where the respective angles with the side surfaces of the conductor layers are the same.

Consequently, the angle formed with the side surface of each of the conductor layers can be adjusted depending on the coefficient of thermal expansion of the conductor layer, so that a shear stress created on a boundary surface between the intermediate layer 12 and the electrode layer 13 can be relaxed. As a result, the fracture and the stripping of the protective film 14 can be restrained.

It is preferable that the angle $\alpha_1$ formed with the side surface of the intermediate layer 12 has an angle not exceeding 80°. If this angle takes a value in a range not exceeding 80°, the protective film 14 can have a sufficient thickness up to a portion close to the main surface 10a of the piezoelectric substrate 10 of the side surface of the electrode finger 11a even when it is formed using a film deposition method in which few evaporated species enter a masked area, for example, evaporation, and thus has good adhesive properties to the intermediate layer 12 and the electrode layer 13.

A difference between the angles ($\alpha_1 - \beta_1$) formed with the side surfaces of the intermediate layer 12 and the electrode layer 13 is preferably in a range of 10° to 20° and more preferably 15°. At this time, the protective film 14 has good adhesive properties to the intermediate layer 12 and the electrode layer 13.

A surface acoustic wave element according to another embodiment of the present invention will be described. Surface acoustic wave elements 2, 3, and 4 (including piezoelectric substrates 20, 30, and 40; their main surfaces 20a, 30a, and 40a; and IDT electrodes 21, 31, and 41) in the following description shall respectively have the same configurations as the surface acoustic wave element 1 (including the piezoelectric substrate 10, its main surface 10a, and the IDT electrode 11) shown in FIG. 1, and the surface acoustic wave element 1' (including the piezoelectric substrate 10', its main surface 10a', and the IDT electrode 11') shown in FIG. 12 in portions that are not particularly referred to.

Figure 5:
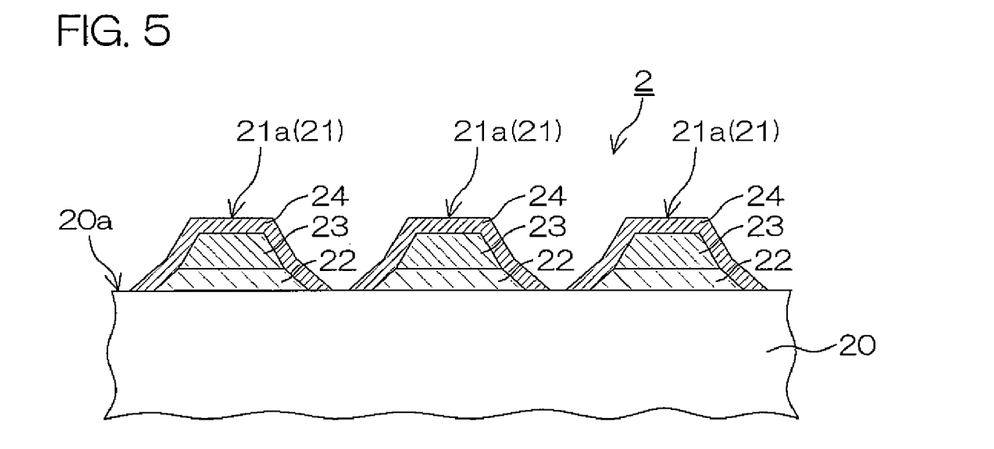
FIG. 5 is a cross-sectional view of a principal part taken along a line B-B shown in FIG. 1 of an IDT electrode included in a surface acoustic wave element 2 according to another embodiment.
Figure 6:
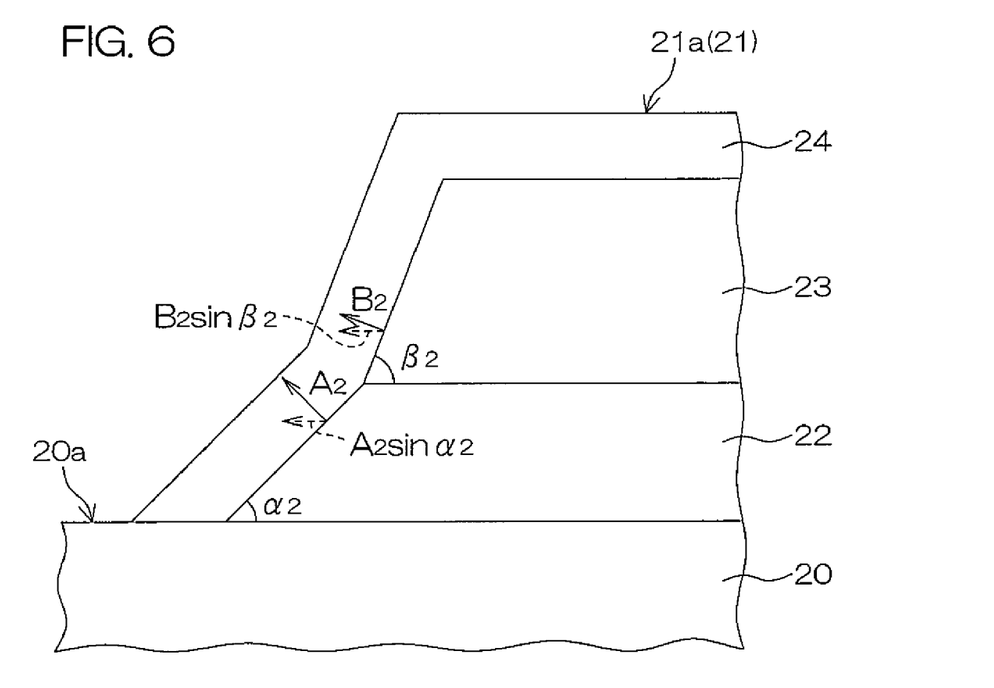
FIG. 6 is an enlarged sectional view of one electrode finger in the IDT electrode.

FIG. 5 is a cross-sectional view of a principal part taken along the line B-B shown in FIG. 1 of the IDT electrode 21 included in the surface acoustic wave element 2 according to another embodiment. FIG. 6 is an enlarged sectional view of one electrode finger 21a in the IDT electrode 21.

The surface acoustic wave element 2 has an electrode finger 21a having a plurality of conductor layers laminated therein provided on a main surface 20a of a piezoelectric substrate 20 as the IDT electrode 21. The electrode finger 21a is covered with a protective film 24.

The electrode finger 21a has two conductor layers, i.e., an intermediate layer 22 serving as a first conductor layer formed on the main surface 20a of the piezoelectric substrate 20 and an electrode layer 23 serving as a second conductor layer formed on the intermediate layer 22 laminated therein, as shown in FIG. 5. Each of the intermediate layer 22 and the electrode layer 23 included in the electrode finger 21a is so formed that its cross section through a plane perpendicular to the longitudinal direction of the electrode finger 21a widens nearer to the main surface 20a of the piezoelectric substrate 20, as shown in FIG. 5. That is, each of the intermediate layer 22 and the electrode layer 23 has a trapezoidal shape in the cross section.

The intermediate layer 22 is formed of a metal material such as an Al alloy having a metal material such as Cu or Mg contained in Al, e.g., an Al—Cu (Cu: 1% by weight) alloy (let $\rho_{22}$ be its coefficient of thermal expansion, $\rho_{22} = 23.5 \times 10^{-6}$/K).

The electrode layer 23 is formed of a metal material such as Ta having a lower coefficient of thermal expansion than that of the material forming the intermediate layer 22 (let $\rho_{23}$ be the coefficient of thermal expansion, $\rho_{23} = 6.6 \times 10^{-6}$/K).

The two conductor layers forming the electrode finger 21a are formed such that an angle $\alpha_2$ (e.g., 60°) formed between a side surface of the intermediate layer 22 and the main surface 20a of the piezoelectric substrate 20 is smaller than an angle $\beta_2$ (e.g., 75°) formed between a side surface of the electrode layer 23 and the main surface 20a of the piezoelectric substrate 20 ($\alpha_2 < \beta_2$), as shown in FIG. 6.

The protective film 24 is provided so as to protect the electrode finger 21a. After the IDT electrode 21 is formed, the protective film 24 is formed by forming a predetermined material on the IDT electrode 21 using a CVD method, similarly to the protective film 14.

An extension occurs by a width $A_2$ of thermal expansion in the vicinity of the side surface of the intermediate layer 22, and an extension occurs by a width $B_2$ of thermal expansion in the vicinity of the side surface of the electrode layer 23. At this time, the coefficient of thermal expansion $\rho_{22}$ of the intermediate layer 22 is higher than the coefficient of thermal expansion $\rho_{23}$ of the electrode layer 23, so that the width $A_2$ of thermal expansion is larger than the width $B_1$ of thermal expansion ($A_2 > B_2$).

Accordingly, the extension occurring in the direction along the main surface 20a of the piezoelectric substrate 20 by the width $A_2$ of thermal expansion is $A_2 \sin \alpha_2$ in the intermediate layer 22, and the extension occurring in the direction along the main surface 20a of the piezoelectric substrate 20 by the width $B_2$ of thermal expansion is $B_2 \sin \beta_2$ in the electrode layer 23. The angle $\alpha_2$ with the side surface of the intermediate layer 22 is smaller than the angle $\beta_2$ with the side surface of the electrode layer 23 ($\sin \alpha_2 < \sin \beta_2$), so that a difference between the respective extensions ($A_2 \sin \alpha_2$ and $B_2 \sin \beta_2$) occurring in the direction along the main surface 20a of the piezoelectric substrate 20 in the conductor layers can be reduced, as compared with that in a case where the respective angles with the side surfaces of the conductor layers are the same.

Consequently, the angle formed with the side surface of each of the conductor layers can be adjusted depending on the coefficient of thermal expansion of the conductor layer, so that a shear stress created on a boundary surface between the intermediate layer 22 and the electrode layer 23 can be relaxed. As a result, the protective film 24 can be prevented from being fractured and stripped.

It is preferable that the angle $\alpha_2$ formed with the side surface of the intermediate layer 22 is an angle in a range of 45° to 80°. The angle is more preferably in a range of 60° to 80°.

The electrode pattern of a high-frequency filter is made finer, so that a small difference of mass on the electrode finger 21a becomes important. The mass difference means a difference in mass between electrodes based on the shape of an electrode thin film on the piezoelectric substrate 20. Here, the shape of the IDT electrode 21, i.e., the mass of the electrode finger 21a forming the IDT electrode 21 affects the excitation of a surface acoustic wave. This is referred to as a "mass effect", and affects the frequency characteristics of the surface acoustic wave. A center frequency in the characteristics may be shifted from a desired value due to the mass (the shape, and particularly the line width and the film thickness) of the electrode thin film. If the angle $\alpha_2$ formed with the side surface of the intermediate layer 22 is an angle exceeding 45°, the above-mentioned mass effect can be reduced, and the design value of the frequency characteristics hardly greatly differs from the actually measured value thereof, so that a stable yield can be obtained.

A difference between the angles ($\alpha_2 - \beta_2$) formed with the side surfaces of the intermediate layer 22 and the electrode layer 23 is preferably in a range of 10° to 20°, and more preferably 15°. At this time, the protective film 24 has good adhesive properties to the intermediate layer 22 and the electrode layer 23.

Figure 7:
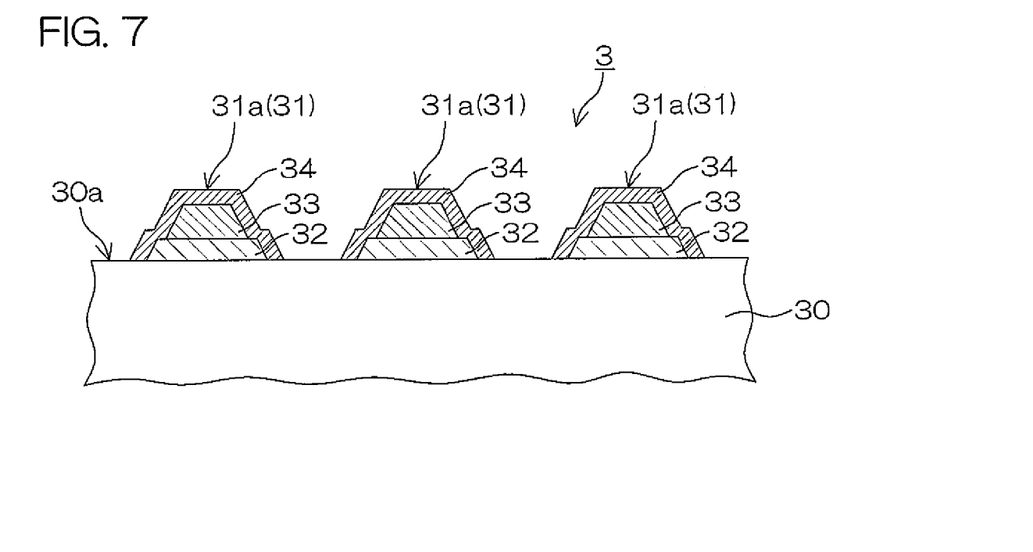
FIG. 7 is a cross-sectional view of a principal part taken along a line B-B shown in FIG. 1 of an IDT electrode included in a surface acoustic wave element 3 according to still another embodiment.
Figure 8:
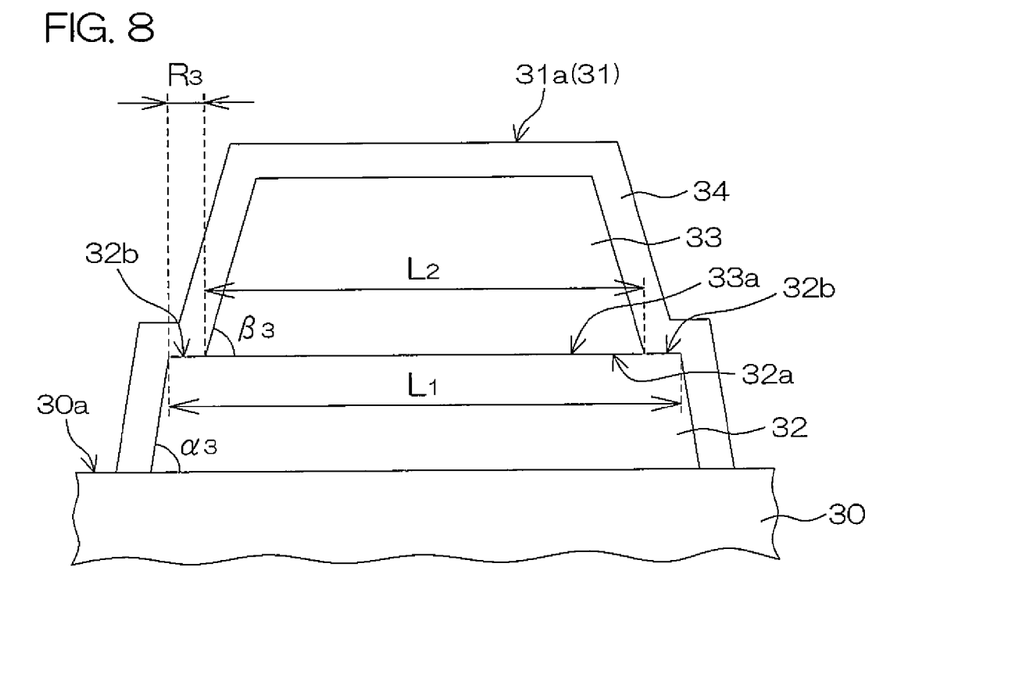
FIG. 8 is an enlarged sectional view of one electrode finger in the IDT electrode.

FIG. 7 is a cross-sectional view of a principal part taken along the line B-B shown in FIG. 1 of the IDT electrode 31 included in the surface acoustic wave element 3 according to still another embodiment. FIG. 8 is an enlarged sectional view of one electrode finger 31a in the IDT electrode 31.

The surface acoustic wave element 3 has an electrode finger 31a having a plurality of conductor layers laminated therein provided on a main surface 30a of a piezoelectric substrate 30 as the IDT electrode 31. The electrode finger 31a is covered with a protective film 34.

The electrode finger 31a has two conductor layers, i.e., an intermediate layer 32 formed on the main surface 30a of the piezoelectric substrate 30 and an electrode layer 33 formed on the intermediate layer 32 laminated therein, as shown in FIG. 7.

Each of the intermediate layer 32 and the electrode layer 33 included in the electrode finger 31a is so formed that its cross section through a plane perpendicular to the longitudinal direction of the electrode finger 31a widens nearer to the main surface 30a of the piezoelectric substrate 30, as shown in FIG. 7. That is, each of the intermediate layer 32 and the electrode layer 33 has a trapezoidal shape in the cross section.

A lower surface of the electrode layer 33 in the electrode finger 31a, i.e., a joint surface 32a to the intermediate layer 32 does not extend out the joint surface 32a of the intermediate layer 32 but is included in the joint surface 32a of the intermediate layer 32.

The width $L_1$ in a cross section of the joint surface 32a on which the intermediate layer 32 is opposed to the electrode layer 33 is formed larger than the width $L_2$ of a cross section of the joint surface 33a on which the electrode layer 33 is opposed to the intermediate layer 32, as shown in FIG. 8.

Therefore, the electrode finger 31a has steps 32b on left and right having an L-shaped longitudinal cross-section and having a width $R_3$ as areas where the protective film 34 can be directly formed on the joint surface 32a of the intermediate layer 32 between a side surface of the intermediate layer 32 and a side surface of the electrode layer 33. In the step 32b, the protective film 34 is directly formed on the joint surface 32a of the intermediate layer 32. The width $L_1$ in the cross section of the joint surface on which the intermediate layer is opposed to the electrode layer can be made larger than the width $L_2$ in the cross section of the joint surface on which the electrode layer is opposed to the intermediate layer by extending an etching time period longer to over-etch when the electrode finger is etched, for example.

The intermediate layer 32 is formed of a metal material such as Ti (let $\rho_{32}$ be its coefficient of thermal expansion, $\rho_{32} = 8.9 \times 10^{-6}$/K).

The electrode layer 33 is formed of a metal material such as an Al alloy having a higher coefficient of thermal expansion than that of the material forming the intermediate layer 32, e.g., an Al—Cu (Cu: 1% by weight) alloy (let $\rho_{33}$ be its coefficient of thermal expansion, $\rho_{33} = 23.5 \times 10^{-6}$/K).

The two conductor layers forming the electrode finger 31a are formed such that an angle $\alpha_3$ (e.g., 65°) formed between the side surface of the intermediate layer 32 and the main surface 30a of the piezoelectric substrate 30 is larger than an angle $\beta_3$ (e.g., 58°) formed between the side surface of the electrode layer 33 and the main surface 30a of the piezoelectric substrate 30 ($\alpha_3 > \beta_3$), as shown in FIG. 8.

Since the angle $\alpha_3$ with the side surface of the intermediate layer 32 is formed larger than the angle $\beta_3$ with the side surface of the electrode layer 33, as described above, a difference in a shear stress created in the electrode finger 31a between the conductor layers can be reduced, as compared with that in a case where the respective angles with the side surfaces of the conductor layers are the same.

This allows to relax a shear stress created on a boundary surface between the intermediate layer 32 and the electrode layer 33 by adjusting the angle formed with the side surface of each of the conductor layers depending on the coefficient of thermal expansion of the conductor layer. As a result, the protective film 34 can be prevented from being fractured and stripped.

The protective film 34 is formed of a material having a lower coefficient of thermal expansion than the largest coefficient of thermal expansion ($\beta_{33}$ in this case) out of the respective coefficients of thermal expansion $\rho_{32}$ and $\rho_{33}$ of the conductor layers (the intermediate layer 32 and the electrode layer 33) forming the IDT electrode 31. This causes an extension due to thermal expansion of the electrode layer 33 is restrained by the protective film 34 on the step 32b. Accordingly, the shear stress created in the boundary between the intermediate layer 32 and the electrode layer 33 can be further restrained. Further, the adhesive properties of the protective film 34 can be improved.

Figure 9:
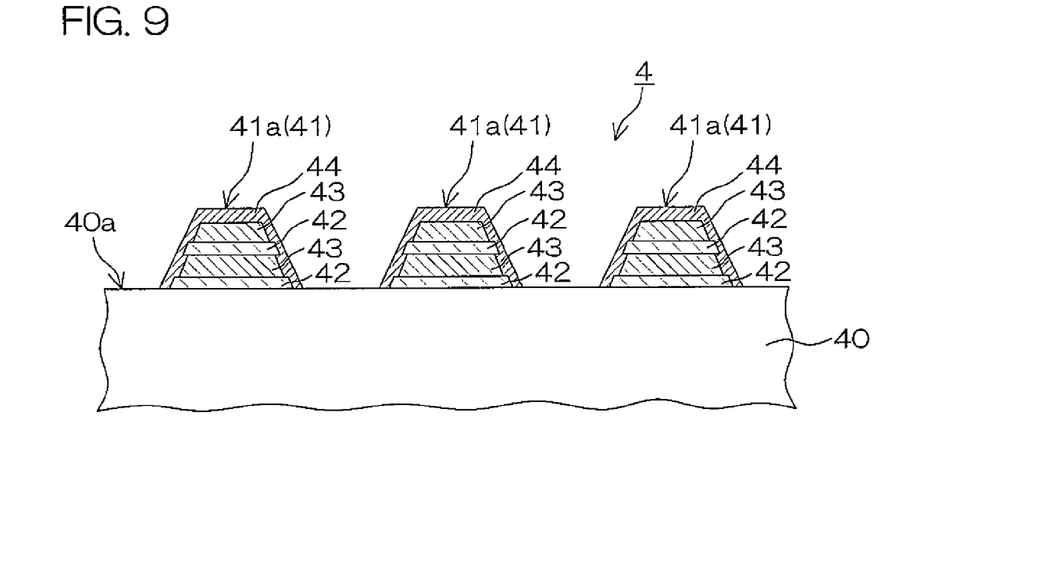
FIG. 9 is a cross-sectional view of a principal part taken along a line B-B shown in FIG. 1 of an IDT electrode included in a surface acoustic wave element 4 according to a still further embodiment.
Figure 10:
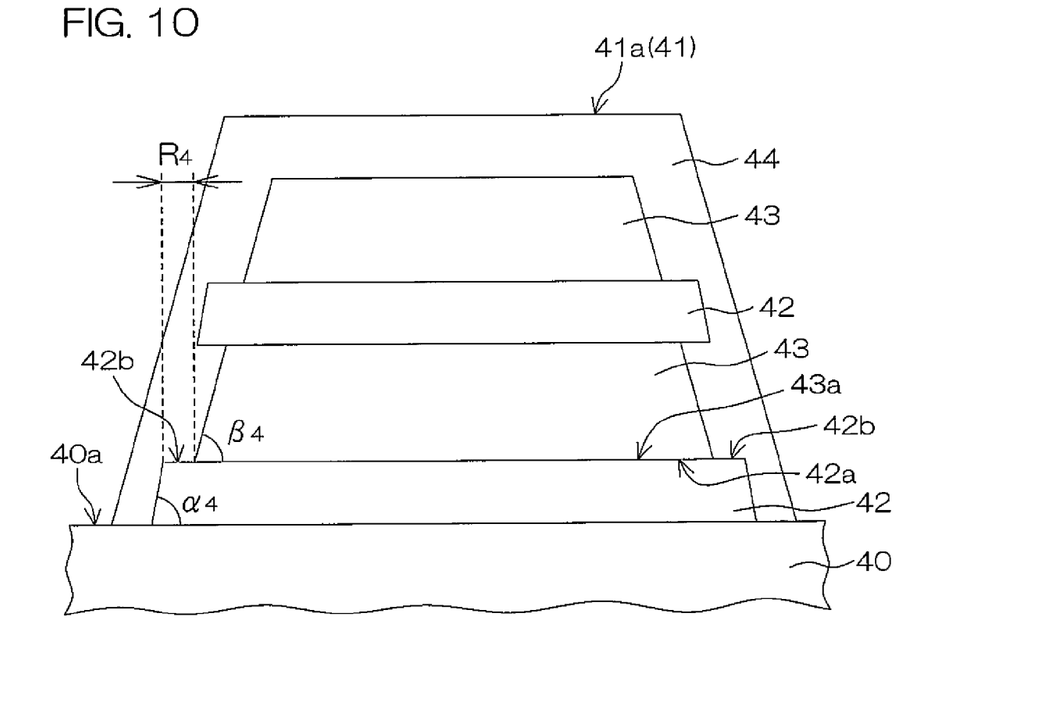
FIG. 10 is an enlarged sectional view of one electrode finger in the IDT electrode.

FIG. 9 is a cross-sectional view of a principal part taken along the line B-B shown in FIG. 1 of the IDT electrode 41 according to a further embodiment. FIG. 10 is an enlarged sectional view of one electrode finger 41a in the IDT electrode 41.

The surface acoustic wave element 4 has an electrode finger 41a having a plurality of conductor layers laminated therein provided on a main surface 40a of a piezoelectric substrate 40 as the IDT electrode 41. The electrode finger 41a is covered with a protective film 44.

The electrode finger 41a has a total of four conductor layers, i.e., an intermediate layer 42 formed on the main surface 40a of the piezoelectric substrate 40 and electrode layer 43 formed thereon that comprise two conductor layers, and another intermediate layer 42 and another electrode layer 43 that comprise two conductor layers, are laminated alternately, as shown in FIG. 9.

Each of the intermediate layer 42 and the electrode layer 43 included in the electrode finger 41a is so formed that its cross section through a plane perpendicular to the longitudinal direction of the electrode finger 41a widens nearer to the main surface 40a of the piezoelectric substrate 40. That is, each of the intermediate layer 42 and the electrode layer 43 has a trapezoidal shape.

The width in a cross section of a joint surface 42a on which the intermediate layer 42 is opposed to the electrode layer 43 in the electrode finger 41a is formed larger than the width in a cross section of a joint surface 43a on which the electrode layer 43 is opposed to the intermediate layer 42, as shown in FIG. 10. Therefore, the electrode finger 41a has steps 42b on left and right having an L-shaped longitudinal cross-section and having a width $R_4$ as areas where the protective film 44 can be directly formed on the joint surface 42a of the intermediate layer 42 between a side surface of the intermediate layer 42 and a side surface of the electrode layer 43. The width in the cross section of the joint surface on which the intermediate layer is opposed to the electrode layer can be made larger than the width in the cross section of the joint surface on which the electrode layer is opposed to the intermediate layer by extending an etching time period longer to over-etch when the electrode finger is etched, for example.

The intermediate layer 42 is formed of a metal material such as Ti (let $\rho_{42}$ be its coefficient of thermal expansion, $\rho_{42}=8.9\times10^{-6}$/K).

The electrode layer 43 is formed of a metal material such as an Al alloy having a higher coefficient of thermal expansion than that of the material forming the intermediate layer 42, e.g., an Al—Cu (Cu: 1% by weight) alloy (let $\rho_{42}$ be its coefficient of thermal expansion, $\rho_{42}=23.5\times10^{-6}$/K).

The plurality of conductor layers forming the electrode finger 41a are formed such that an angle $\alpha_4$ (e.g., 74°) formed between the side surface of the intermediate layer 42 and the main surface 40a of the piezoelectric substrate 40 is larger than an angle $\beta_4$ (e.g., 60°) formed between the side surface of the electrode layer 43 and the main surface 40a of the piezoelectric substrate 40 ($\alpha_4 > \beta_4$), as shown in FIG. 10.

The protective film 44 is formed of a material having a lower coefficient of thermal expansion than the largest coefficient of thermal expansion ($\rho_{43}$ in this case) out of the respective coefficients of thermal expansion $\rho_{42}$ and $\rho_{43}$ of the conductor layers 42 and 43 forming the IDT electrode 41.

Since the angle $\alpha_4$ with the side surface of the intermediate layer 42 is formed larger than the angle $\beta_4$ with the side surface of the electrode layer 43, as described above, a difference in a shear stress created in the electrode finger 41a between the conductor layers can be reduced, as compared with that in a case where the respective angles with the side surfaces of the conductor layers are the same. In addition thereto, the width in the cross section of the joint surface 43a of the electrode layer 43 is formed smaller than the width in the cross section of the joint surface 42a of the intermediate layer 42, so that the protective film 44 laminated on the step 42b can restrain an extension due to thermal expansion of the electrode layer 43. This allows to relax a shear stress created in the boundary between the intermediate layer 42 and the electrode layer 43. As a result, the protective film 44 can be prevented from being fractured and stripped.

In the step 42b, the protective film 44 is directly formed on the joint surface 42a of the intermediate layer 42. Therefore, the extension of the electrode layer 43 having the larger coefficient of thermal expansion $\rho_{43}$ than that of the intermediate layer 42 in a direction toward the main surface 40a of the piezoelectric substrate 40 can be restrained.

In the present embodiment, the electrode finger 41a is formed by three or more conductor layers, so that the durability of the electrode finger 41a can be further improved.

Figure 11:
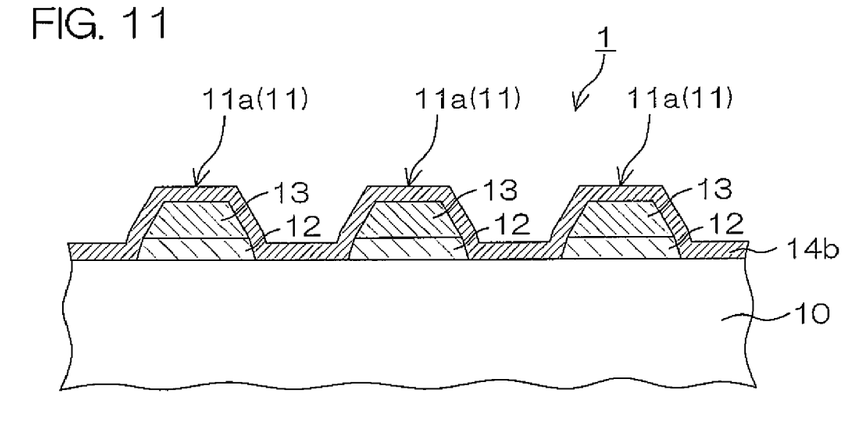
FIG. 11 is an enlarged sectional view showing a state where an insulation protective film is formed on an electrode finger in an IDT electrode included in a surface acoustic wave element 1.

Although description is made to the embodiment in which the conductor protective film is formed only on the IDT electrode in the above-mentioned surface acoustic wave element 1, an insulation protective film 14b can be further formed on an upper surface of a conductor protective film of an electrode finger 11a, or an insulation protective film 14b can be formed in place of the conductor protective film, as shown in FIG. 11. This allows to enhance adhesive properties between the electrode finger 11a and a piezoelectric substrate 10 while protecting the IDT electrode 11. In a case where the insulation protective film 14b is formed, the insulation protective film 14b may be also formed on a main surface of the piezoelectric substrate 10. It goes without saying that insulation protective films are also formed on the IDT electrodes 21, 31, and 41 in the surface acoustic wave elements 2, 3, and 4, respectively.

EXAMPLES

Example 1

A surface acoustic wave element 1 shown in FIGS. 3 and 4 was manufactured. A substrate formed of a LiTaO$_3$ single crystal as a material having piezoelectric properties was used as a piezoelectric substrate 10.

Ti was deposited as an intermediate layer 12 on the piezoelectric substrate 10 using a sputtering method, and an Al—Cu, (Cu: 1% by weight) alloy having Cu contained in Al was deposited as an electrode layer 13 on the intermediate layer 12. The film thicknesses of Ti and an Al—Cu alloy were respectively 18 nm and 402 nm.

An IDT electrode 11 and a reflector 19 were formed by patterning their shapes using a photolithographic technique, followed by a dry etching method.

In the dry etching method, Cl$_2$, BCl$_3$ and N$_2$ were used as reaction gas, and etching conditions such as gas flow rate, pressure, and applied power were adjusted to adjust an etching selection ratio of Ti and an Al—Cu alloy.

That is, the etching conditions such as gas flow rate, pressure, applied power, and time were adjusted to control a side etching amount depending on a difference in etching rates between Ti and an Al—Cu alloy to adjust angles of inclination $\alpha_1$ and $\beta_1$. Specifically, an RIB apparatus used was an ICP (Inductive Coupled Plasma)-RIE apparatus, the etching conditions were a $BCl_3$ gas flow rate of 20 sccm, a $Cl_2$ gas flow rate of 20 sccm, a $N_2$ gas flow rate of 10 sccm, a pressure of 1.0 Pa, a bias power of 60 W, and an etching time period required for processing of approximately 60 seconds.

As an angle with a side surface of an electrode finger 11a at this time, an angle $\alpha_1$ with the side surface of the intermediate layer 12 was 65° and an angle $\beta_1$ with the side surface of the electrode layer 13 was 58° when the main surface 10a of the piezoelectric substrate 10 was used as a reference.

After the intermediate layer 12 and the electrode layer 13 were formed, a metal layer (Ti) serving as a protective film 14 was then formed by a sputtering method using a mask used at the time of the dry etching.

Even if a high frequency was applied to the surface acoustic wave element 1 thus manufactured, or an ambient temperature was changed, the protective film 14 was not stripped. High yields were obtained within a wafer surface and between wafers of the surface acoustic wave element 1.

Example 2

A surface acoustic wave element 2 shown in FIGS. 5 and 6 was manufactured. A substrate formed of a $LiTaO_3$ single crystal as a material having piezoelectric properties was used as a piezoelectric substrate 20.

An Al—Cu (Cu: 1% by weight) alloy was first deposited as an intermediate layer 22 on the piezoelectric substrate 20 using a sputtering method, and Ti was deposited as an electrode layer 23 on the intermediate layer 22. The film thicknesses of Ti and an Al—Cu alloy were 90 nm and 281 nm, respectively.

An IDT electrode 21 and a reflector (not shown) were formed by patterning their shapes using a photolithographic technique, followed by a dry etching method. At this time, an etching selection ratio of the intermediate layer 22 and the electrode layer 23 was adjusted. Further, an angle formed between a side surface of each of conductor layers included in an electrode finger 21a and a main surface 20a of the piezoelectric substrate 20 was adjusted to be a designed angle using the dry etching method. The etching conditions were a $BCl_3$ gas flow rate of 20 sccm, a $Cl_2$ gas flow rate of 20 sccm, a $N_2$ gas flow rate of 20 sccm, a pressure of 1.0 Pa, a bias power of 60 W, and an etching time period required for processing of approximately 60 seconds.

As an angle with a side surface of the electrode finger 21a at this time, an angle $\alpha_2$ with the side surface of the intermediate layer 22 was 60° and an angle $\beta_2$ with the side surface of the electrode layer 23 was 75° when the main surface 20a of the piezoelectric substrate 20 was used as a reference.

After the intermediate layer 22 and the electrode layer 23 were formed, a protective film 24 was formed of $SiO_2$ using a sputtering method. An unnecessary portion of the protective film 34 was trimmed by the dry etching method.

Even if a high frequency was applied to the surface acoustic wave element 2 thus manufactured, or an ambient temperature was changed, the protective film 24 was not stripped.

Example 3

A surface acoustic wave element 3 shown in FIGS. 7 and 8 was manufactured. A substrate formed of an $LiTaO_3$ single crystal as a material having piezoelectric properties was used as a piezoelectric substrate 30.

Ti was then deposited as an intermediate layer 32 on the piezoelectric substrate 30 using a sputtering method, and an Al—Cu (Cu: 1% by weight) alloy was deposited as an electrode layer 33 on the intermediate layer 32. The film thicknesses of Ti and an Al—Cu alloy were 18 nm and 402 nm, respectively.

An IDT electrode 31 and a reflector (not shown) were formed by patterning their respective shapes using a photolithographic technique, followed by a dry etching method. In the dry etching method, $Cl_2$, $BCl_3$ and $N_2$ were used as reaction gas, and etching conditions such as gas flow rate, pressure, and applied power were adjusted to adjust an etching selection ratio of the intermediate layer 32 and the electrode layer 33. Further, an angle formed between a side surface of each of conductor layers included in an electrode finger 31a and a main surface 30a of the piezoelectric substrate 30 was adjusted to be a designed angle using the dry etching method. The etching conditions were a $BCl_3$ gas flow rate of 20 sccm, a $Cl_2$ gas flow rate of 20 sccm, a $N_2$ gas flow rate of 10 sccm, a pressure of 1.0 Pa, a bias power of 60 W, and an etching time period required for processing of approximately 70 seconds.

As an angle with a side surface of the electrode finger 31a at this time, an angle $\alpha_3$ with the side surface of the intermediate layer 32 was 65° and an angle $\beta_3$ with the side surface of the electrode layer 33 was 58° when the main surface 30a of the piezoelectric substrate 30 was used as a reference.

Furthermore, when the electrode finger 31a was etched, the width in a cross section of a joint surface 33a of the electrode layer 33 was smaller by 8 nm on each of the left and right sides than the width in a cross section of a joint surface 32a of the intermediate layer 32 (see $R_3$ in FIG. 8) by overetching.

The intermediate layer 32 and the electrode layer 33 were formed, followed by patterning using photolithography, and a protective film 34 was formed of $SiO_2$ using sputtering. An unnecessary portion of the protective film 34 was trimmed by the dry etching method.

Even if a high frequency was applied to the surface acoustic wave element 3 thus manufactured, or an ambient temperature was changed, the protective film 34 was not stripped.

Example 4

A surface acoustic wave element 4 shown in FIGS. 9 and 10 was manufactured. A substrate formed of a $LiTaO_3$ single crystal as a material having piezoelectric properties was used as a piezoelectric substrate 40.

Ti serving as an intermediate layer 42 was first deposited on the piezoelectric substrate 40 using a sputtering method, and an Al—Cu (Cu: 1% by weight) alloy serving as an electrode layer 43 was deposited on the intermediate layer 42. In such a way, two intermediate layers 42 and two electrode layers 43, or four layers are alternately laminated on a main surface 40a of the piezoelectric substrate 40. The film thicknesses of Ti and an Al—Cu alloy were 6 nm and 130 nm per layer, respectively.

An IDT electrode 41 and a reflector (not shown) were formed by patterning their shapes using a photolithographic technique, followed by a dry etching method. In the dry etching method, $Cl_2$, $BCl_3$ and $N_2$ were used as reaction gas, and etching conditions such as gas flow rate, pressure, and applied power were adjusted to adjust an etching selection ratio of the intermediate layer 42 and the electrode layer 43. Further, an angle formed between a side surface of each of conductor layers included in an electrode finger 41a and a main surface 40a of the piezoelectric substrate 40 was adjusted to be a designed angle using the dry etching method. The etching conditions were a $BCl_3$ gas flow rate of 20 sccm, a Cl$_2$ gas flow rate of 20 sccm, a N$_2$ gas flow rate of 10 sccm, a pressure of 1.0 Pa, a bias power of 60 W, and an etching time period required for processing of approximately 60 seconds.

As an angle with a side surface of the electrode finger 41a at this time, an angle α$_4$ with the side surface of the intermediate layer 42 was 74° and an angle β$_4$ with the side surface of the electrode layer 43 was 60° when the main surface 40a of the piezoelectric substrate 40 was used as a reference.

Furthermore, when the electrode finger 41a was etched, the width in a cross section of a joint surface 42a of the intermediate layer 42 was larger by 16 nm on each of the left and right sides than the width in a cross section of a joint surface 43a of the electrode layer 43 (see R$_4$ in FIG. 10).

The intermediate layer 42 and the electrode layer 43 were formed, followed by patterning using photolithography, and a protective film 44 was formed of SiO$_2$ using sputtering.

Even if a high frequency was applied to the surface acoustic wave element 4 thus manufactured, or an ambient temperature was changed, the protective film 44 was not stripped.

The invention claimed is:

1. A surface acoustic wave element comprising: a piezoelectric substrate; and
   an IDT electrode formed on a main surface of the piezoelectric substrate and having an electrode finger; wherein
   the electrode finger is formed by laminating a plurality of conductor layers including a first conductor layer and a second conductor layer formed of a material different from a material forming the first conductor layer,
   the first conductor layer has a trapezoidal shape that widens nearer to the piezoelectric substrate in a cross section, through a plane perpendicular to the longitudinal direction of the electrode finger,
   the second conductor layer has a trapezoidal shape that widens nearer to the piezoelectric substrate in a cross section through a plane perpendicular to the longitudinal direction of the electrode finger,
   the second conductor layer is formed of a material having a lower coefficient of thermal expansion than the material forming the first conductor layer, and
   the angle formed between the side surface of the first conductor layer and the main surface of the piezoelectric substrate is formed smaller than the angle formed between the side surface of the second conductor layer and the main surface of the piezoelectric substrate.

2. A surface acoustic wave element comprising: a piezoelectric substrate; and
   an IDT electrode formed on a main surface of the piezoelectric substrate and having an electrode finger; wherein
   the electrode finger is formed by laminating a plurality of conductor layers including a first conductor layer and a second conductor layer formed of a material different from a material forming the first conductor layer,
   the first conductor layer has a trapezoidal shape that widens nearer to the piezoelectric substrate in a cross section, through a plane perpendicular to the longitudinal direction of the electrode finger,
   the second conductor layer has a trapezoidal shape that widens nearer to the piezoelectric substrate in a cross section through a plane perpendicular to the longitudinal direction of the electrode finger,
   an angle formed between a side surface of the first conductor layer and the main surface of the piezoelectric substrate differs from an angle formed between a side surface of the second conductor layer and the main surface of the piezoelectric substrate,
   the first conductor layer is formed in contact with the main surface of the piezoelectric substrate,
   the second conductor layer is formed on the first conductor layer, and
   a width of the cross section adjacent to the second conductor layer of the first conductor layer is formed larger than a width of the cross section adjacent to the first conductor layer of the second conductor layer.

3. A surface acoustic wave element comprising: a piezoelectric substrate; and
   an IDT electrode formed on a main surface of the piezoelectric substrate and having an electrode finger; wherein
   the electrode finger is formed by laminating a plurality of conductor layers including a first conductor layer and a second conductor layer formed of a material different from a material forming the first conductor layer,
   the first conductor layer has a trapezoidal shape that widens nearer to the piezoelectric substrate in a cross section, through a plane perpendicular to the longitudinal direction of the electrode finger,
   the second conductor layer has a trapezoidal shape that widens nearer to the piezoelectric substrate in a cross section through a plane perpendicular to the longitudinal direction of the electrode finger,
   the first conductor layer is formed in contact with the main surface of the piezoelectric substrate,
   the second conductor layer is formed on the first conductor layer,
   a third conductor layer formed of the same material as the material forming the first conductor layer is formed on the second conductor layer,
   a fourth conductor layer formed of the same material as the material forming the second conductor layer is formed on the third conductor layer,
   an angle formed between a side surface of the first conductor layer and the main surface of the piezoelectric substrate differs from an angle formed between a side surface of the second conductor layer and the main surface of the piezoelectric substrate,
   an angle formed between a side surface of the third conductor layer and the main surface of the piezoelectric substrate is formed substantially equal to the angle formed between the side surface of the first conductor layer and the main surface of the piezoelectric substrate, and
   an angle formed between a side surface of the fourth conductor layer and the main surface of the piezoelectric substrate is formed substantially equal to the angle formed between the side surface of the second conductor layer and the main surface of the piezoelectric substrate.

4. The surface acoustic wave element according to claim 1, wherein a cross-sectional shape of the first conductor layer and a cross-sectional shape of the second conductor layer are formed by a dry etching method.

5. The surface acoustic wave element according to claim 1, wherein the electrode finger in the ID electrode is covered with a protective film.

6. The surface acoustic wave element according to claim 5, wherein the protective film is formed of a material having a lower coefficient of thermal expansion than the one having the largest coefficient of thermal expansion among the conductor layers forming the electrode finger.

7. The surface acoustic wave element according to claim 5, wherein
   the protective film is formed on the IDT electrode, and the protective film contains at least one of Ti, Cr, Nb, Pd, Cu, and Ni as a material.

8. A surface acoustic wave device, wherein the surface acoustic wave element according to claim 1 is mounted on a mounting substrate.

9. The surface acoustic wave element according to claim 2, wherein a cross-sectional shape of the first conductor layer and a cross-sectional shape of the second conductor layer are formed by a dry etching method.

10. The surface acoustic wave element according to claim 2, wherein the electrode finger in the ID electrode is covered with a protective film.

11. The surface acoustic wave element according to claim 10, wherein the protective film is formed of a material having a lower coefficient of thermal expansion than the one having the largest coefficient of thermal expansion among the conductor layers forming the electrode finger.

12. The surface acoustic wave element according to claim 10, wherein
the protective film is formed on the IDT electrode, and
the protective film contains at least one of Ti, Cr, Nb, Pd, Cu, and Ni as a material.

13. A surface acoustic wave device, wherein the surface acoustic wave element according to claim 2 is mounted on a mounting substrate.

14. The surface acoustic wave element according to claim 3, wherein a cross-sectional shape of the first conductor layer and a cross-sectional shape of the second conductor layer are formed by a dry etching method.

15. The surface acoustic wave element according to claim 3, wherein the electrode finger in the ID electrode is covered with a protective film.

16. The surface acoustic wave element according to claim 15, wherein the protective film is formed of a material having a lower coefficient of thermal expansion than the one having the largest coefficient of thermal expansion among the conductor layers forming the electrode finger.

17. The surface acoustic wave element according to claim 15, wherein
the protective film is formed on the IDT electrode, and
the protective film contains at least one of Ti, Cr, Nb, Pd, Cu, and Ni as a material.

18. A surface acoustic wave device, wherein the surface acoustic wave element according to claim 3 is mounted on a mounting substrate.

19. A surface acoustic wave element comprising:
a piezoelectric substrate; and
an IDT electrode formed on a main surface of the piezoelectric substrate and having an electrode finger; wherein
the electrode finger is formed by laminating a plurality of conductor layers including a first conductor layer formed on the main surface of the piezoelectric substrate and a second conductor layer formed on the first conductor, the second conductor layer being formed of a material different from a material forming the first conductor layer,
the first conductor layer has a trapezoidal shape that widens nearer to the piezoelectric substrate in a cross section, through a plane perpendicular to the longitudinal direction of the electrode finger,
the second conductor layer has a trapezoidal shape that widens nearer to the piezoelectric substrate in a cross section through a plane perpendicular to the longitudinal direction of the electrode finger,
an angle($\alpha$) formed between a side surface of the first conductor layer and the main surface of the piezoelectric substrate differs from an angle($\beta$) formed between a side surface of the second conductor layer and the main surface of the piezoelectric substrate, and a difference between the angles is in a range of 10° to 20°.

* * * * *